(12) United States Patent
Son et al.

(10) Patent No.: US 8,455,316 B2
(45) Date of Patent: Jun. 4, 2013

(54) METHOD OF MANUFACTURING VERTICAL SEMICONDUCTOR DEVICE

(75) Inventors: Yong-Hoon Son, Hwasung (KR);
Jong-Wook Lee, Hwasung (KR);
Jong-Hyuk Kang, Hwasung (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 13/325,189

(22) Filed: Dec. 14, 2011

(65) Prior Publication Data

US 2012/0088343 A1  Apr. 12, 2012

Related U.S. Application Data

(62) Division of application No. 12/585,776, filed on Sep. 24, 2009, now abandoned.

(30) Foreign Application Priority Data

Sep. 26, 2008  (KR) .................. 10-2008-0094800

(51) Int. Cl.
*H01L 21/8242* (2006.01)
*H01L 27/108* (2006.01)

(52) U.S. Cl.
CPC .................. *H01L 27/10852* (2013.01)
USPC .................. 438/239; 257/E21.409

(58) Field of Classification Search
USPC .................. 438/239, 305, 156, 206, 210, 212, 438/269; 257/E21.409
See application file for complete search history.

(56) References Cited

U.S. PATENT DOCUMENTS

| | | |
|---|---|---|
| 5,994,735 A | 11/1999 | Maeda et al. |
| 2007/0232007 A1* | 10/2007 | Forbes .................. 438/301 |
| 2007/0284623 A1 | 12/2007 | Kim et al. |
| 2008/0099816 A1 | 5/2008 | Brown |
| 2009/0163000 A1* | 6/2009 | Cho et al. .................. 438/492 |

FOREIGN PATENT DOCUMENTS

| | | |
|---|---|---|
| KR | 10-2007-0047069 A | 5/2007 |
| KR | 10-2007-0047572 A | 5/2007 |

* cited by examiner

*Primary Examiner* — Matthew Reames
(74) *Attorney, Agent, or Firm* — Lee & Morse, P.C.

(57) ABSTRACT

A vertical semiconductor device, a DRAM device, and associated methods, the vertical semiconductor device including single crystalline active bodies vertically disposed on an upper surface of a single crystalline substrate, each of the single crystalline active bodies having a first active portion on the substrate and a second active portion on the first active portion, and the first active portion having a first width smaller than a second width of the second active portion, a gate insulating layer on a sidewall of the first active portion and the upper surface of the substrate, a gate electrode on the gate insulating layer, the gate electrode having a linear shape surrounding the active bodies, a first impurity region in the upper surface of the substrate under the active bodies, and a second impurity region in the second active portion.

18 Claims, 14 Drawing Sheets

METHOD OF MANUFACTURING VERTICAL SEMICONDUCTOR DEVICE

CROSS REFERENCE TO RELATED APPLICATION

This is a divisional application based on application Ser. No. 12/585,776, filed Sep. 24, 2009 now abandoned, the entire contents of which is hereby incorporated by reference.

BACKGROUND

1. Field

Embodiments relate to a vertical semiconductor device, a DRAM device including the same, and associated methods.

2. Description of the Related Art

As semiconductor devices have become highly integrated, a gate length of a MOS transistor in the semiconductor device may gradually decrease. Thus, it may be desirable that the MOS transistor have a three-dimensional structure.

For example, in order to increase an integration degree of a semiconductor device, cell transistors of a unit chip may include vertical pillar transistors having a channel direction extending substantially vertically from an upper surface of a semiconductor substrate. The vertical pillar transistor may have a relatively smaller horizontal area and a relatively longer channel length when compared to those of a planar transistor. However, because the vertical pillar transistor may require complicated manufacturing processes, it may be difficult to produce the vertical pillar transistors on a large scale.

The vertical pillar transistor may include a gate on a sidewall of a vertical semiconductor pillar. Thus, the vertical pillar transistor may have variable characteristics in accordance with the vertical semiconductor pillar. In order to improve operational characteristics of the vertical pillar transistor, it may be desirable to form a vertical semiconductor pillar having good charge conduction characteristics without defects.

SUMMARY

Embodiments are directed to a vertical semiconductor device, a DRAM device including the same, and associated methods, which substantially overcome one or more of the drawbacks, limitations, and/or disadvantages of the related art.

It is a feature of an embodiment to provide a vertical semiconductor device having good channel characteristics.

It is another feature of an embodiment to provide a method of manufacturing a vertical semiconductor device by simple processes.

At least one of the above and other features and advantages may be realized by providing a vertical semiconductor device including single crystalline active bodies vertically disposed on an upper surface of a single crystalline substrate, each of the single crystalline active bodies having a first active portion on the substrate and a second active portion on the first active portion, and the first active portion having a first width smaller than a second width of the second active portion, a gate insulating layer on a sidewall of the first active portion and the upper surface of the substrate, a gate electrode on the gate insulating layer, the gate electrode having a linear shape surrounding the active bodies, a first impurity region in the upper surface of the substrate under the active bodies, and a second impurity region in the second active portion.

The active bodies may be formed by a laser epitaxial process.

The first width may be about 5 nm to about 30 nm.

At least one of the above and other features and advantages may also be realized by providing a method of manufacturing a vertical semiconductor device including implanting impurities into a single crystalline substrate to form a first impurity region, forming a sacrificial layer structure on an upper surface of the substrate, such that the sacrificial layer structure has holes exposing the first impurity region on the upper surface of the single-crystalline substrate, forming inner spacers on side surfaces of the holes, vertically forming single crystalline active bodies in the holes on the upper surface of the single crystalline substrate, such that each of the single crystalline active bodies has a first active portion on the substrate and a second active portion on the first active portion and such that the first active portion has a first width smaller than a second width of the second active portion, forming a gate insulating layer on a sidewall of the first active portion and the upper surface of the substrate, forming a gate electrode on the gate insulating layer, such that the gate electrode has a linear shape surrounding the active bodies, and implanting impurities into the second active portion to form a second impurity region.

Forming the sacrificial layer structure may include forming a sacrificial layer on the substrate, forming a first protecting layer on the sacrificial layer, and etching the sacrificial layer and the first protecting layer to form the sacrificial layer structure having the holes.

Forming the sacrificial layer may include forming a pad oxide layer on the substrate, forming a silicon nitride layer on the pad oxide layer, and forming a silicon oxide layer on the silicon nitride layer.

The method may further include forming a second protecting layer on the sacrificial layer structure to cover the active bodies.

The method may further include patterning the sacrificial layer structure to expose the sacrificial layer, and removing the sacrificial layer and inner spacers to expose the sidewall of the first active portion.

The gate insulating layer may be formed on the exposed sidewall of the first active portion.

The inner spacer may have an upper surface lower than that of the sacrificial layer structure.

A distance between the upper surface of the inner spacer and the upper surface of the sacrificial layer structure may be substantially the same as a length of the second active portion.

A width between the inner spacers in the hole may be about 5 nm to about 30 nm.

Forming the active bodies may include filling an opening between the inner spacers with a polysilicon layer pattern, and thermally treating the polysilicon layer pattern using a laser to form the active bodies.

Forming the gate insulating layer and the gate electrode may include oxidizing surfaces of the first active portion and the substrate to form the gate insulating layer, forming a conductive layer on the substrate to cover the gate insulating layer, and patterning the conductive layer to form the linear gate electrode.

At least one of the above and other features and advantages may also be realized by providing a DRAM device including single crystalline active bodies vertically disposed on an upper surface of a single crystalline substrate, each of the single crystalline active bodies having a first active portion on the substrate and a second active portion on the first active portion, and the first active portion having a first width smaller than a second width of the second active portion, a gate insulating layer on a sidewall of the first active portion and the upper surface of the substrate, a gate electrode on the gate insulating layer, the gate electrode having a linear shape surrounding the active bodies, and the gate electrode being usable with a word line, a first impurity region in the upper surface of the substrate under the active bodies, a second impurity region in the second active portion, a bit line structure electrically connected to the first impurity region, and a capacitor electrically connected to the second impurity region.

The first width may be about 5 nm to about 30 nm.

The substrate may have an isolation region and an active region, and the active region may have an extending direction at an angle of no more than about 90° with respect to the gate electrode.

The DRAM may further include a protecting layer covering an upper surface and an upper sidewall of the active bodies.

At least one of the above and other features and advantages may also be realized by providing a method of manufacturing a DRAM device including implanting impurities in an upper surface of a single crystalline substrate to form a first impurity region, forming a sacrificial layer structure on an upper surface of the substrate, such that the sacrificial layer structure has holes exposing the first impurity region in the upper surface of the single-crystalline substrate, forming inner spacers on side surfaces of the holes, vertically forming single crystalline active bodies on the upper surface of the single crystalline substrate, such that each of the single crystalline active bodies has a first active portion on the substrate and a second active portion on the first active portion and such that the first active portion has a first width smaller than a second width of the second active portion, forming a gate insulating layer on a sidewall of the first active portion and the upper surface of the substrate, forming a gate electrode on the gate insulating layer, such that the gate electrode has a linear shape surrounding the active bodies, implanting impurities into the second active portion to form a second impurity region, electrically connecting a bit line structure to the first impurity region, and electrically connecting a capacitor to the second impurity region.

Forming the active bodies may include filling an opening between the inner spacers with a polysilicon layer pattern, and thermally treating the polysilicon layer pattern using a laser to form the active bodies.

BRIEF DESCRIPTION OF THE DRAWINGS

The above and other features and advantages will become more apparent to those of ordinary skill in the art by describing in detail exemplary embodiments with reference to the attached drawings, in which.

DETAILED DESCRIPTION

Figure 1:
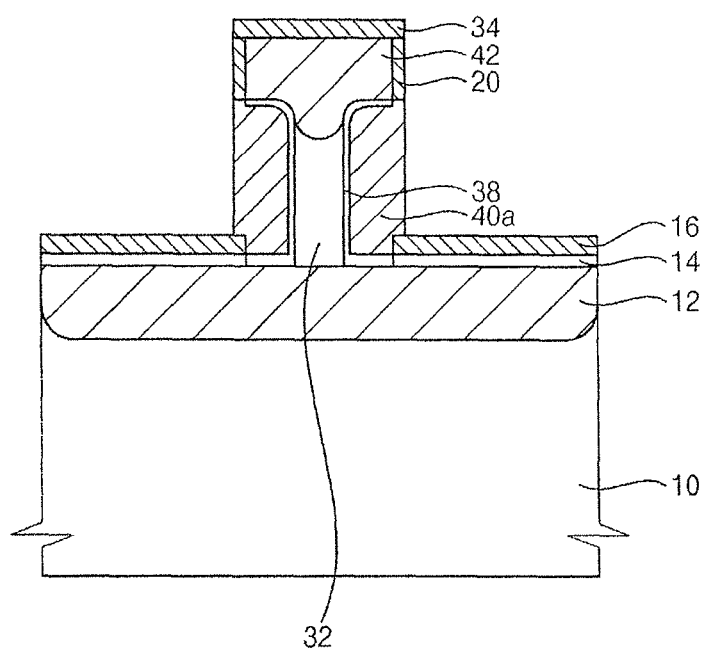
FIG. 1 illustrates a cross-sectional view of a vertical transistor in accordance with an embodiment.

Korean Patent Application No. 10-2008-0094800, filed on Sep. 26, 2008, in the Korean Intellectual Property Office, and entitled: "Vertical Semiconductor Device and Method of Manufacturing the Same," is incorporated by reference herein in its entirety.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the invention to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

It will be understood that when an element or layer is referred to as being "connected to" or "coupled to" another element or layer, it can be directly connected or coupled to the other element or layer or intervening elements or layers may be present. In contrast, when an element is referred to as being "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the present invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, embodiments will be explained in detail with reference to the accompanying drawings.

Vertical Transistor

Figure 2:
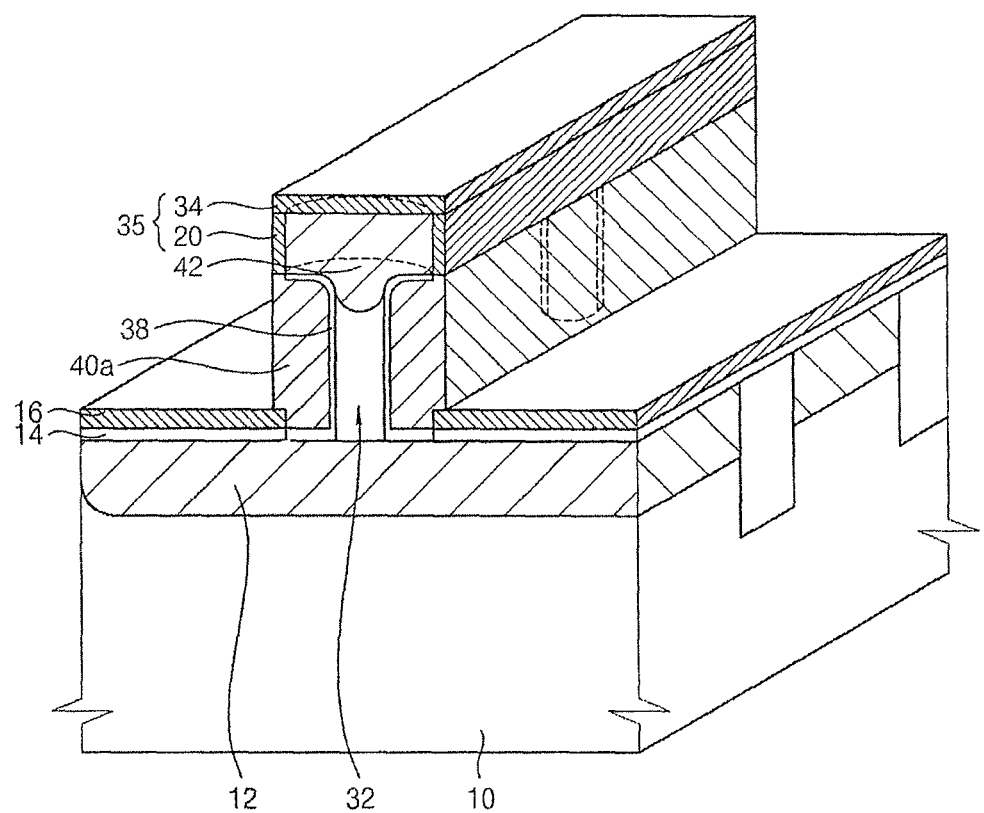
FIG. 2 illustrates a perspective view of the vertical transistor of FIG. 1.
Figure 3:
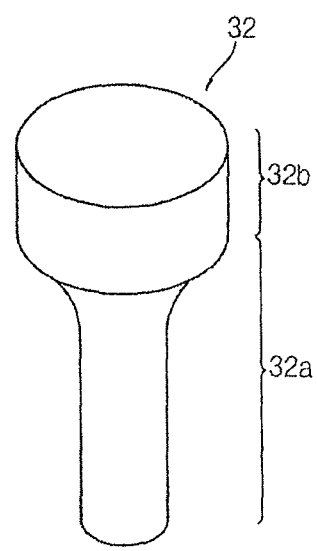
FIG. 3 illustrates a perspective view of a single crystalline epitaxial layer pattern of the vertical transistor of FIG. 1.

FIG. 1 illustrates a cross-sectional view of a vertical transistor in accordance with an embodiment. FIG. 2 illustrates a perspective view of the vertical transistor of FIG. 1. FIG. 3 illustrates a perspective view of a single crystalline epitaxial layer pattern of the vertical transistor of FIG. 1.

Referring to FIGS. 1 to 3, a single crystalline epitaxial layer pattern 32 may contact an upper surface of a single crystalline semiconductor substrate 10. The epitaxial layer pattern 32 may have, e.g., a pillar shape. That is, the epitaxial layer pattern 32 may have a shape vertically extending from the upper surface of the semiconductor substrate 10. The epitaxial layer pattern 32 may serve as an active body.

The epitaxial layer pattern 32 may have a first active portion 32a and a second active portion 32b on the first active portion 32a. The first active portion 32a may serve as a channel region of the vertical transistor. The second active portion 32b may serve as a contact plug. Thus, hereinafter, the first active portion 32a may be referred to as a channel portion and the second active portion 32b may be referred to as a contact portion.

The channel portion 32a may have a width of about 5 nm to about 30 nm. Preferably, the width is about 10 nm. Thus, the channel portion 32a may have a nano-wire structure. Such a structure may enable a desirable volume inversion in the channel region of the vertical transistor.

The contact portion 32b may have a width greater than that of the channel portion 32a. Accordingly, the contact portion 32b may have an upper surface on which a contact plug may be easily formed.

An intersection portion between the channel portion 32a and the contact portion 32b may have a gradually decreased width in a downward direction. The width of the channel portion 32a may allow the volume inversion. The channel portion 32a may have a lower surface that contacts the upper surface of the semiconductor substrate 10. The single crystalline epitaxial layer pattern 32 may be formed by, e.g., a laser epitaxial process.

A gate insulating layer 38 may be formed on a sidewall of the channel portion 32a and the upper surface of the semiconductor substrate 10. The gate insulating layer 38 may include, e.g., silicon oxide formed by a thermal oxidation process.

A gate electrode 40a may be formed on the gate insulating layer 38 to surround the single crystalline epitaxial layer pattern 32. The gate electrode 40a may have a linear shape surrounding adjacent single crystalline epitaxial layer patterns 32. The gate electrode 40a may have an upper surface lower than an upper surface of the single crystalline epitaxial layer pattern 32. Therefore, because the gate electrode 40a may surround the single crystalline epitaxial layer pattern 32, and the channel portion 32a of the epitaxial layer pattern 32 may be a nano-wire, the channel region may be formed both inside the epitaxial layer pattern 32 as well as on a surface of the epitaxial layer pattern 32.

A first impurity region 12 may be formed in the upper surface of the semiconductor substrate 10 under the single crystalline epitaxial layer pattern 32. A second impurity region 42 may be formed in the contact portion 32b of the epitaxial layer pattern 32.

A protecting layer pattern 35 may be formed on a side upper surface and the upper surface of the epitaxial layer pattern 32. The protecting layer pattern 35 may include a first protecting layer 20 on the side upper surface of the epitaxial layer pattern 32 and a second protecting layer 34 on the upper surface of the epitaxial layer pattern 32. The protecting layer pattern 35 may have a linear shape extending in a direction substantially in parallel with that of the gate electrode 40a. A pad oxide layer 14 and a silicon nitride layer 16 may be sequentially formed on the semiconductor substrate 10 between the gate electrodes 40a of the vertical transistors.

According to an embodiment, the channel region of the vertical semiconductor device may be formed as a nano-wire in the single crystalline epitaxial layer pattern. Thus, the channel region may be formed by volume inversion, not surface inversion, during operation of the vertical transistor. Accordingly, the vertical semiconductor device may have good conductivity in the channel region and thus an increased current passing through the channel region. As a result, the vertical semiconductor device may have improved operational characteristics.

Method of Manufacturing a Vertical Transistor

Figure 4:
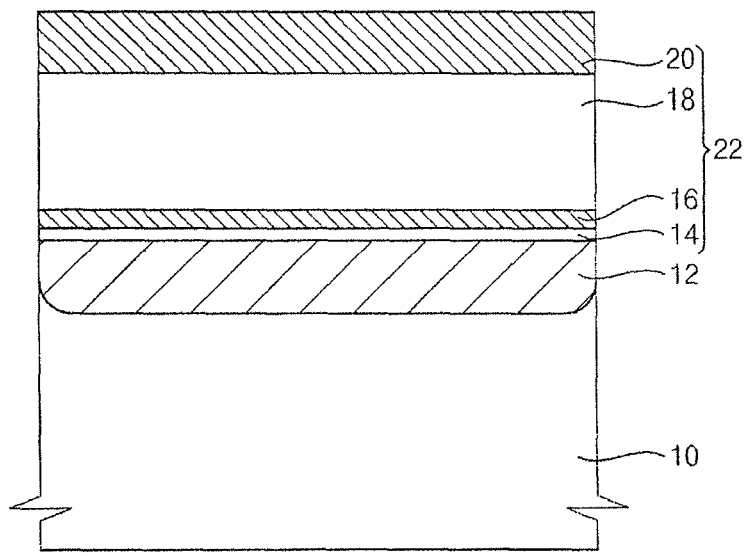
FIGS. 4 to 13 illustrate cross-sectional views of stages in a method of manufacturing the vertical transistor of FIG. 1.

FIGS. 4 to 13 illustrate cross-sectional views of stages in a method of manufacturing the vertical transistor in FIG. 1. Referring to FIG. 4, impurities may be implanted into a single crystalline semiconductor substrate 10 to form a first impurity region 12. The first impurity region 12 may be used as any one of a source region and a drain region of the vertical transistor.

A sacrificial layer structure 22 may be formed on the semiconductor substrate 10. The sacrificial layer may be formed by the following steps. A pad oxide layer 14 may be formed on the semiconductor substrate 10. A silicon nitride layer 16 may be formed on the pad oxide layer 14. The pad oxide layer 14 interposed between the silicon nitride layer 16 and the semiconductor substrate 10 may reduce stresses between the silicon nitride layer 16 and the semiconductor substrate 10. A silicon oxide layer 18 may then be formed on the silicon nitride layer 16. The silicon oxide layer 18 may have an upper surface substantially aligned with an end of a channel portion in a single crystalline epitaxial layer pattern to be formed later, as described below. A first protecting layer 20 may then be formed on the silicon oxide layer 18. The first protecting layer 20 may include, e.g., silicon nitride. Accordingly, the sacrificial layer structure 22 may include the sequentially stacked pad oxide layer 14, silicon nitride layer 16, silicon oxide layer 18, and first protecting layer 20.

Figure 5:
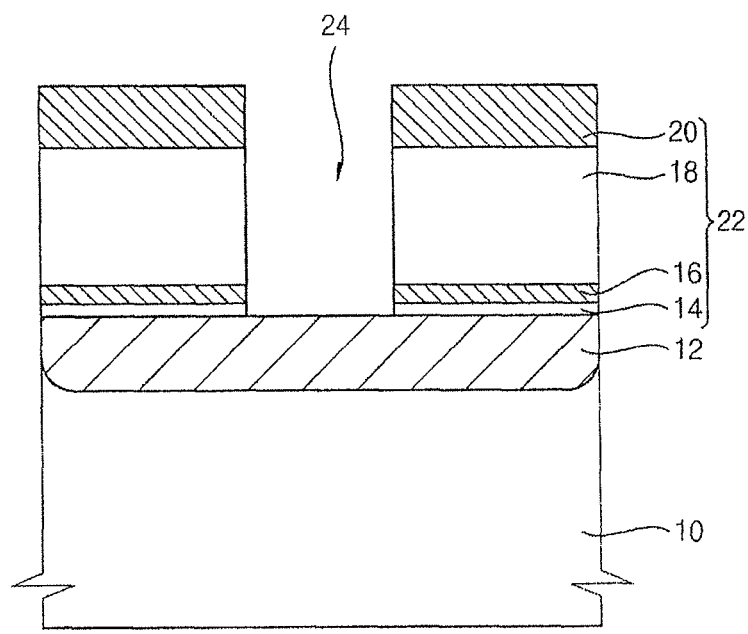

Referring to FIG. 5, the sacrificial layer structure 22 may be partially etched to form a first opening 24, i.e., hole, exposing at least a portion of the upper surface of the semiconductor substrate 10 in the first impurity region 12. The first opening 24 may be located in a region where the single crystalline epitaxial layer pattern will be formed, as described below.

Although not depicted in drawings, a plurality of first openings 24 may be regularly arranged at substantially the same interval. Further, the first opening 24 may have a minimum width formed by a photolithography process. The first opening 24 may have a width of about 30 nm to about 50 nm.

Figure 6:
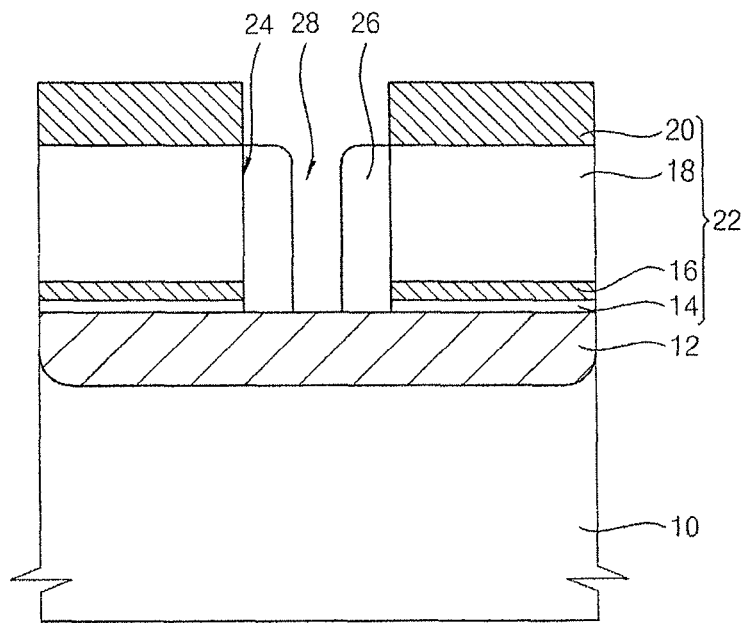

Referring to FIG. 6, a spacer layer (not shown) may be formed on a side surface and a bottom surface of the first opening 24. The spacer layer may have an etching selectivity higher than that of the first protecting layer 20. That is, during etching of the spacer layer, preventing etching of the first protecting layer 20 may be desirable. Further, the spacer layer may include a material substantially the same as that of a layer beneath the first protecting layer 20, i.e., the silicon oxide layer 18. This may allow removal of the silicon oxide layer 18 together with the spacer layer. Accordingly, the spacer layer may include silicon oxide.

A space between portions of the spacer layers on opposing sidewalls of the first opening 24 may correspond to a pillar width of the channel of portion in the vertical transistor to be formed later, as described below. Thus, the pillar width of the channel portion in the vertical transistor may be adjusted by controlling a thickness of the spacer layer. For example, in order to form a desired pillar width, the spacer layer may have a thickness substantially the same as a half of a desired decrease width from the width of the first opening 24.

In order to provide the vertical transistor with a nano-wire structure that enables a volume inversion in the vertical transistor, the pillar width of the channel portion may be about 5 nm to about 30 nm. Preferably, the pillar width of the channel portion is about 10 nm. Thus, when the first opening 24 has a width of about 30 nm and a desired pillar width is about 10 nm, the spacer layer may have a width of about 10 nm.

The spacer layer may then be anisotropically etched to form an inner spacer 26 on the side surface of the first opening 24. The inner spacer 26 may have an upper surface lower than the upper surface of the sacrificial layer structure 22. Preferably, the upper surface of the inner spacer 26 is aligned substantially coplanar with that of the silicon oxide layer 18. Such a configuration may enable a sidewall of a contact portion of the later formed single crystalline epitaxial layer pattern to be protected by the first protecting layer 20. Hereinafter, a portion of the first opening 24 remaining after the inner spacer 26 has been formed is referred to a second opening 28.

The contact portion of the single crystalline epitaxial layer pattern may be formed in a space of the second opening 28 between the upper surface of the inner spacer 26 and the upper surface of the sacrificial layer structure 22. Thus, a thickness of the contact portion may be adjusted by controlling an etched thickness of the inner spacer 26. Further, the channel portion of the single crystalline epitaxial layer pattern may be formed in a space of the second opening 28 between the upper surface of the inner spacer 26 and the upper surface of the semiconductor substrate 10. Therefore, a thickness of the channel portion may be adjusted by controlling the etched thickness of the inner spacer 26. As a result, a doping concentration in the second impurity region may be readily controlled by adjusting the thickness of the contact portion.

Figure 7:
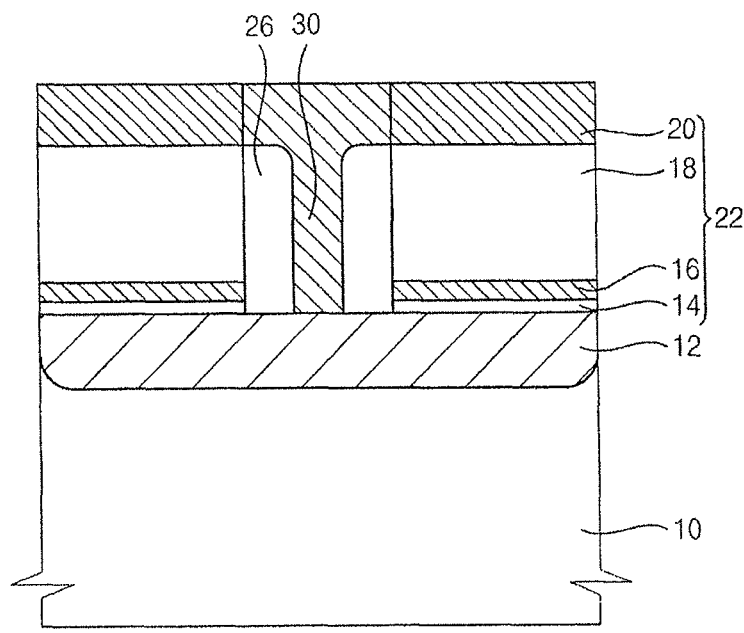

Referring to FIG. 7, a polysilicon layer (not shown) may be formed on the sacrificial layer structure 22 and fill the second opening 28. The polysilicon layer may be formed by, e.g., a low pressure chemical vapor deposition (LPCVD) process. The LPCVD process may be performed in-situ with a channel doping process.

The polysilicon layer may be planarized by, e.g., a chemical mechanical polishing (CMP) process, until the upper surface of the sacrificial layer structure 22 is exposed to form a polysilicon layer pattern 30. Alternatively, an amorphous silicon layer may be formed in the second opening 28. The amorphous silicon layer may be planarized to form an amorphous silicon layer pattern.

Figure 8:
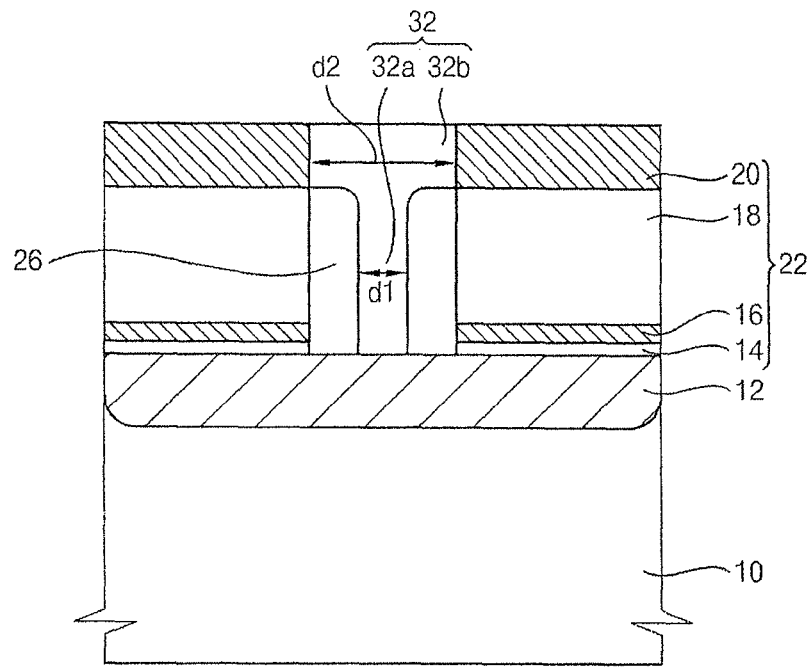

Referring to FIG. 8, a laser epitaxial growth process may be performed on the semiconductor substrate 10 to convert the polysilicon layer pattern 30 into the single crystalline epitaxial layer pattern 32.

The laser used in the epitaxial growth process may have an energy density sufficient for completely melting the polysilicon layer pattern 30. Particularly, the laser may irradiate the polysilicon layer pattern 30 to melt the polysilicon layer pattern 30, thereby converting a solid phase into a liquid phase in the polysilicon layer pattern 30. The phase change may be generated from an upper surface of the polysilicon layer pattern 30 to the upper surface of the semiconductor substrate 10. In order to melt the polysilicon layer pattern 30, the laser may have a temperature of about 1,410° C., corresponding to a melting temperature of the polysilicon layer pattern 30.

The single crystalline semiconductor substrate 10 may function as a seed for the liquefied polysilicon layer pattern 30 to convert the crystalline structure into a single crystalline structure in the polysilicon layer pattern 30. A laser emitter for irradiating the laser may include, e.g., a gas laser emitter such as an excimer laser emitter. In order to reduce an irradiation time of the laser, the laser emitter may have a scan function.

During the laser irradiation, the single crystalline semiconductor substrate 10 may be heated. The heating of the semiconductor substrate 10 may reduce a temperature gradient in the polysilicon layer pattern 30. For example, the single crystalline semiconductor substrate 10 may be heated to a temperature of about 400° C. during the laser irradiation.

As mentioned above, the laser may irradiate the polysilicon layer pattern 30 to convert the crystalline structure into the single crystalline structure in the polysilicon layer pattern 30, thereby forming the pillar-shaped single crystalline epitaxial layer pattern 32 on the single crystalline semiconductor substrate 10.

The single crystalline epitaxial layer pattern 32 may have a shape vertically protruding from the upper surface of the semiconductor substrate 10. The single crystalline epitaxial layer pattern 32 may serve as an active body.

The single crystalline epitaxial layer pattern 32 may have a channel portion 32a and a contact portion 32b. The channel portion 32a may be formed on the upper surface of the semiconductor substrate 10. Further, the channel portion 32a may have a first width d1. The channel portion 32a may be used as a channel region of the vertical transistor. The contact portion 32b may be formed on the channel portion 32a. The contact portion 32b may have a second width d2 greater than the first width d1 of the channel portion 32a. The contact portion 32b may be an impurity region of the vertical transistor.

Alternatively, the single crystalline epitaxial layer pattern 32 may be formed by, e.g., a solid phase epitaxial regrowth process, a metal induced crystallization process using a metal catalyst, etc. That is, the polysilicon layer pattern 30 may be thermally treated using a furnace at a temperature of about 600° C. to about 700° C. to convert the crystalline structure into the single crystalline structure.

Figure 9:
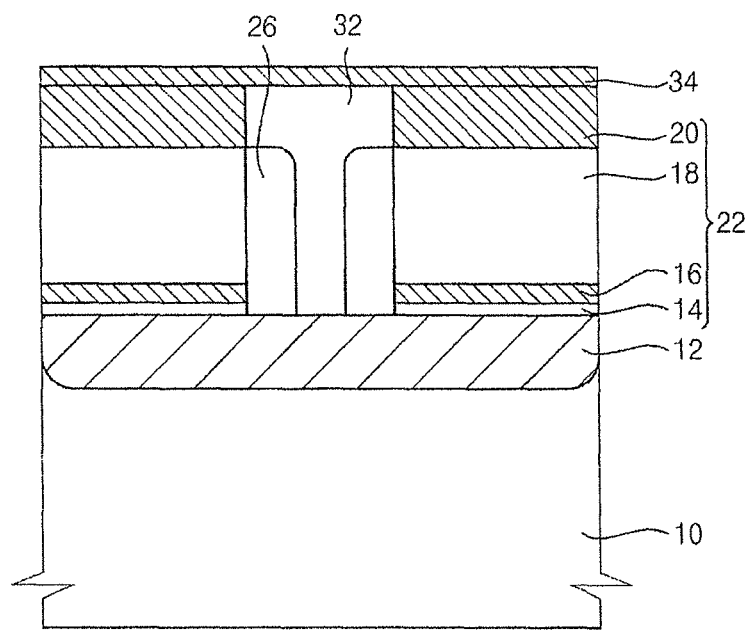

Referring to FIG. 9, a second protecting layer 34 may then be formed on the single crystalline epitaxial layer pattern 32 and the sacrificial layer structure 22. Therefore, the upper sidewall and upper surface of the single crystalline epitaxial layer pattern 32 may be covered with the first protecting layer 20 and the second protecting layer 34.

Figure 10:
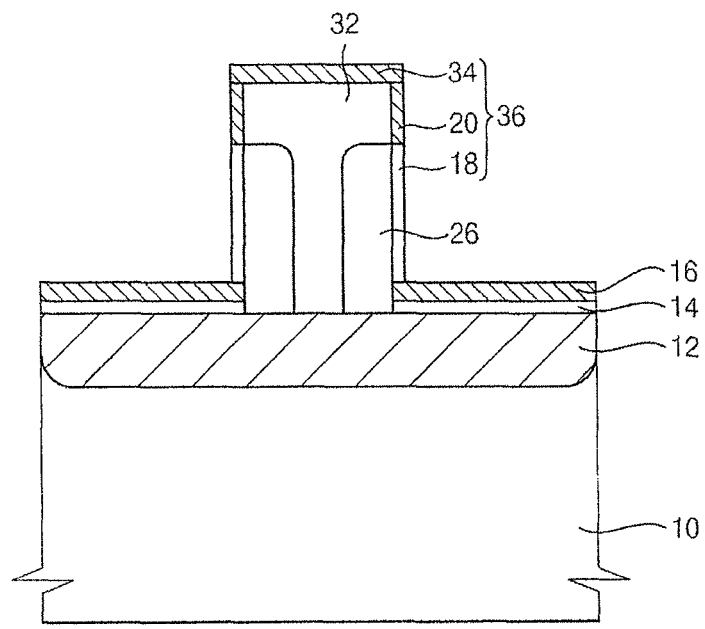

Referring to FIG. 10, the second protecting layer 34, the first protecting layer 20, and the silicon oxide layer 18 may be etched to form a stacked structure 36. The stacked structure 36 may have a linear shape covering the single crystalline epitaxial layer pattern 32. In addition, the stacked structure 36 may extend in a direction substantially the same as an extending direction of a gate electrode to be formed later, as described below. That is, the first protecting layer 20 and the second protecting layer 34 may have a linear extending shape covering the upper sidewall and the upper surface of the single crystalline epitaxial layer pattern 32.

Figure 11:
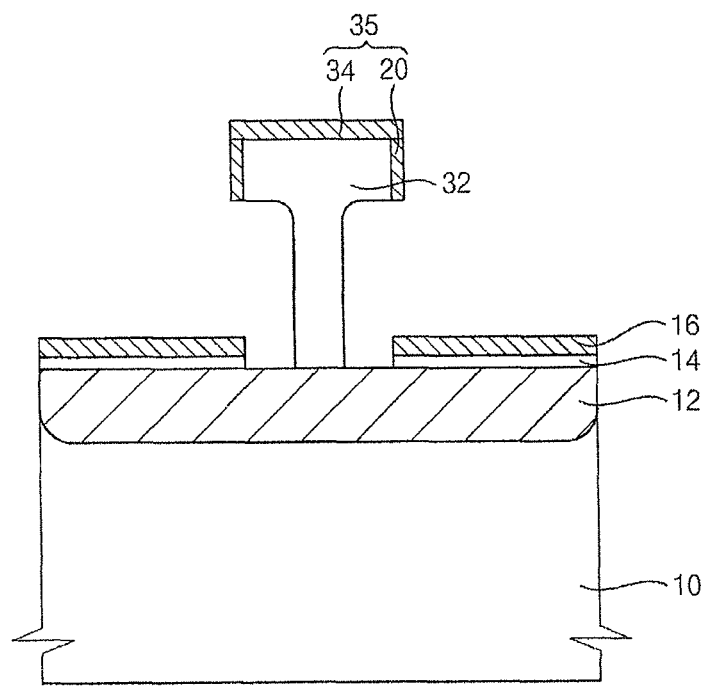

Referring to FIG. 11, the silicon oxide layer 18 and the inner spacer 26 in the stacked structure 36 may be removed by, e.g., an isotropic etching process. When the isotropic etching process is completed, the sidewall of the single crystalline epitaxial layer pattern 32 where the channel region will be formed may be exposed. Portions of the first protecting layer 20 and the second protecting layer 34 may still remain.

Figure 12:
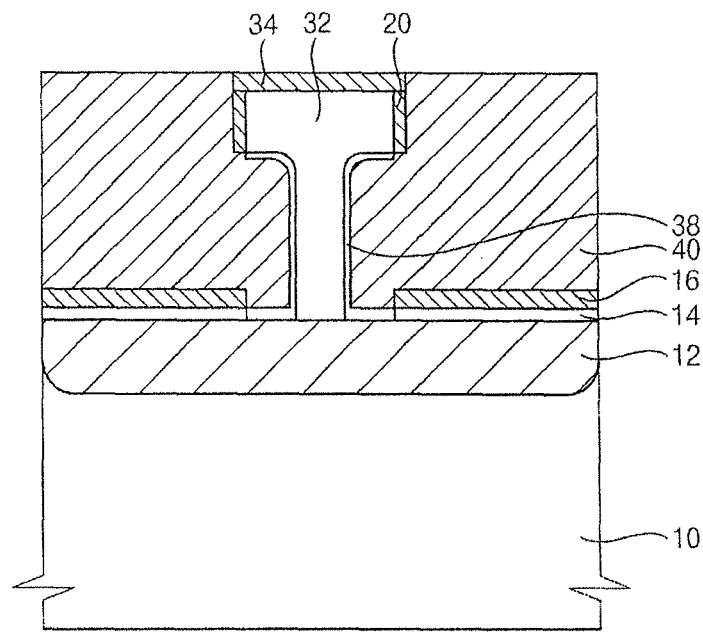

Referring to FIG. 12, a gate insulating layer 38 may be formed on the sidewall of the single crystalline epitaxial layer pattern 32, e.g., the channel portion 32a, and the upper surface of the semiconductor substrate 10. The gate insulating layer 38 may be formed by, e.g., a thermal oxidation process. The gate insulating layer 38 may not be formed on the contact portion 32b of the epitaxial layer pattern 32 and the silicon nitride layer 16. Thus, the gate insulating layer 38 may be formed only on the channel portion 32a of the epitaxial layer pattern 32.

A gate conductive layer 40 may be formed on the gate insulating layer 38 and the semiconductor substrate 10 to cover the single crystalline epitaxial layer pattern 32. The gate conductive layer 40 may include polysilicon formed by, e.g., an LPCVD process. The gate conductive layer 40 may be planarized until the upper surface of the second protecting layer 34 is exposed.

Figure 13:
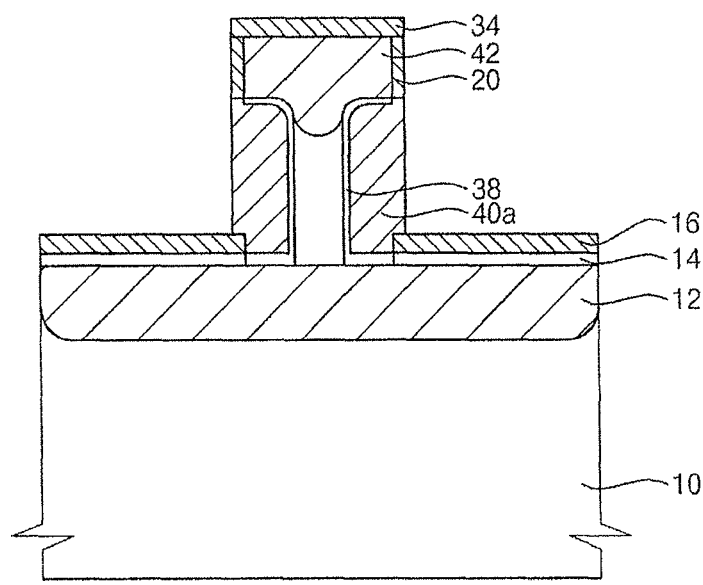

Referring to FIG. 13, the gate conductive layer 40 may then be patterned to form a gate electrode 40a. The gate electrode 40a may have a linear shape surrounding the single crystalline epitaxial layer pattern 32. The gate electrode 40a may be formed by, e.g., an etching process. The etching process may use the silicon nitride layer 16 as an etching stop layer.

As illustrated in FIG. 2, the gate electrode 40a may surround each of the regularly arranged single crystalline epitaxial layer patterns 32.

Impurities may be implanted into the contact portion 32b of the epitaxial layer pattern 32 to form a second impurity region 42. The second impurity region 42 may be used for any one of the source region and the drain region of the vertical transistor. In an implementation, prior to forming the second impurity region 42, the silicon nitride layer 16 may be removed by, e.g., a wet etching process.

Alternatively, the process for forming the second impurity region 42 may be performed between the process for forming the single crystalline epitaxial layer pattern 32 and the process for forming the gate electrode 40a.

According to this embodiment, the vertical transistor having the nano-wire shaped channel region may be manufactured by simple processes.

DRAM Device

Figure 14:
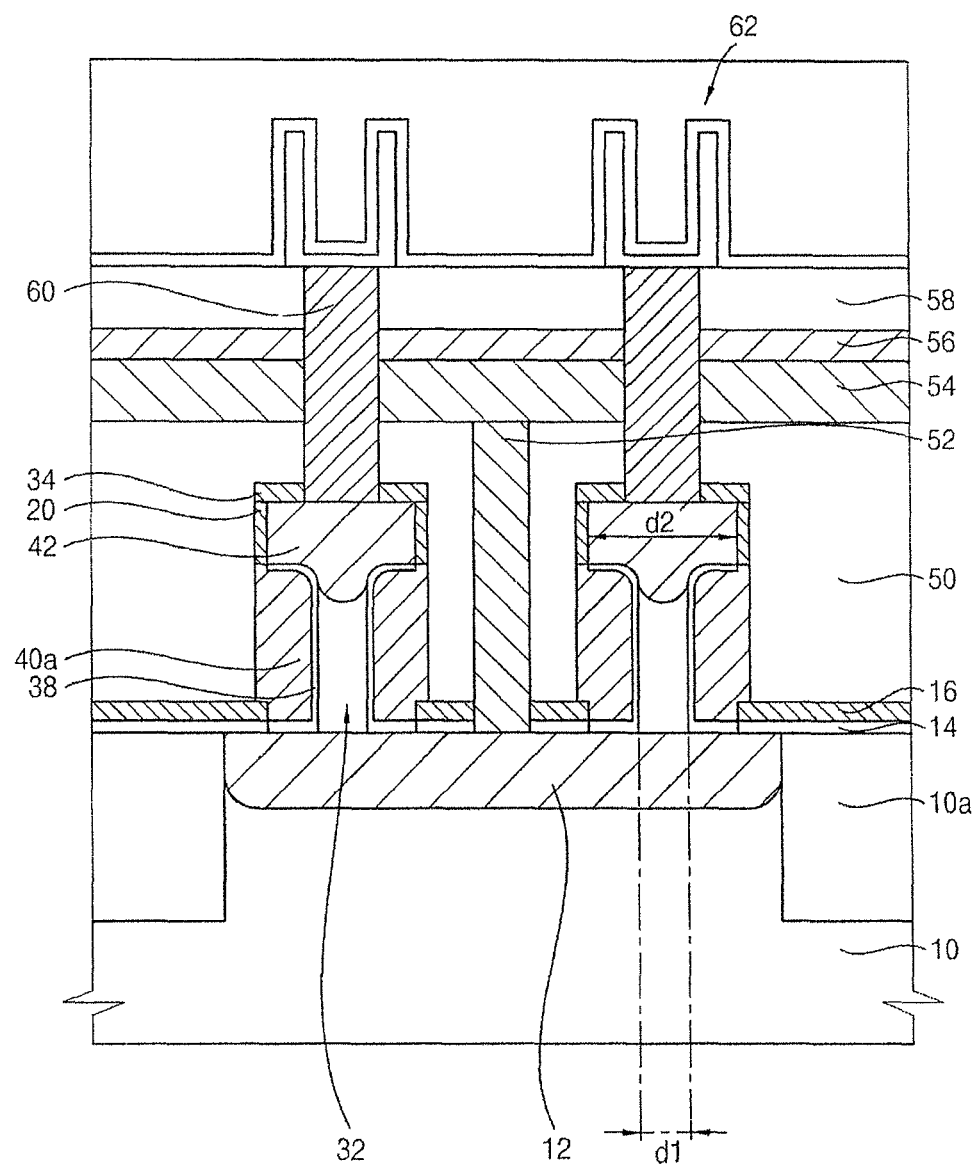
FIG. 14 illustrates a cross-sectional view of a DRAM device including the vertical transistor of FIG. 1.
Figure 15:
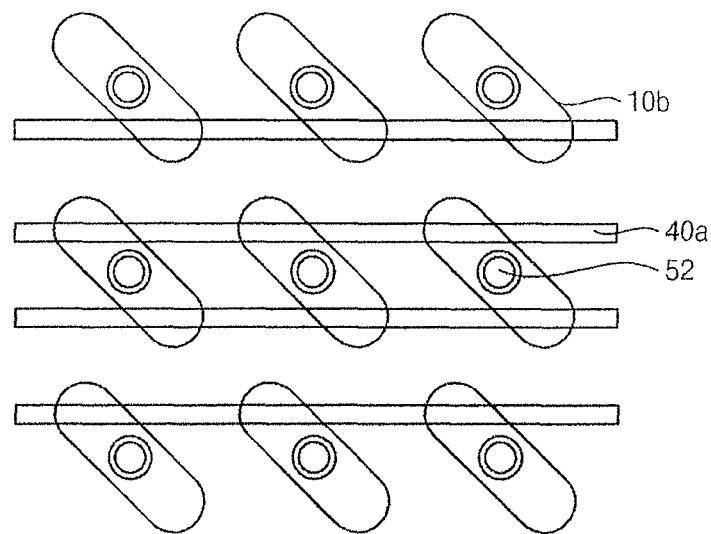
FIG. 15 illustrates a plan view of a DRAM device including the vertical transistor of FIG. 1.

FIG. 14 illustrates a cross-sectional view of a DRAM device including the vertical transistor of FIG. 1. FIG. 15 illustrates a plan view of a DRAM device including the vertical transistor of FIG. 1.

Here, the DRAM device of FIGS. 14 and 15 of the embodiment may include a vertical transistor substantially the same as that illustrated in FIG. 1. Thus, any further illustrations with respect to the vertical transistor are omitted herein for brevity. Further, a bit line is omitted in FIG. 15.

Referring to FIGS. 14 and 15, a semiconductor substrate 10 may have an active region 10b and an isolation region 10a. The semiconductor substrate 10 may include single crystalline silicon. The isolation region 10a may be defined by isolation layer patterns formed in an upper surface of the semiconductor substrate 10. The active region 10b may have an isolated shape repeatedly arranged. A first impurity region 12 may be formed in the upper surface of the semiconductor substrate 10 in the active region 10b.

A pillar-shaped single crystalline epitaxial layer pattern 32 may contact the active region 10b. The single crystalline epitaxial layer pattern 32 may be used as an active body. The single crystalline epitaxial layer pattern 32 may protrude vertically from the upper surface of the semiconductor substrate 10.

The two single crystalline epitaxial layer patterns 32 may be spaced apart from each other in a single isolated active region 10b. The single crystalline epitaxial layer pattern 32 may have a channel portion having a first width and a contact portion on the channel portion having a second width that may be greater than the first width. The first width may be about 5 nm to about 30 nm. Here, the single crystalline epitaxial layer pattern 32 may have a structure substantially the same as that of the single crystalline epitaxial layer pattern of FIGS. 1 to 3.

A gate insulating layer 38 may be formed on a sidewall of the channel region of the epitaxial layer pattern 32 and the upper surface of the semiconductor substrate 10. The gate insulating layer 38 may be formed by, e.g., a thermal oxidation process. The gate insulating layer 38 may not be formed on the contact portion.

A gate electrode 40a may be formed on the gate insulating layer 38. The gate electrode 40a may have a linear shape surrounding the epitaxial layer pattern 32. Thus, the gate electrode 40a may be used commonly with a word line. That is, the gate electrode 40a may not have an isolated shape.

Thus, the linear gate electrode 40a may be used as the word line without forming a separate word line in contact with the gate electrode 40a.

The gate electrode 40a and the active region 10b may extend at an angle of no more than about 90° relative to one another. That is, the gate electrode 40a may be arranged inclined, not substantially perpendicular, relative to the active region 10b.

A second impurity region 42 may be formed in the contact portion of the single crystalline epitaxial layer pattern 32. A first insulating interlayer 50 may cover the single crystalline epitaxial layer pattern 32. The first insulating interlayer 50 may include, e.g., silicon oxide.

A bit line contact 52 may be formed through the first insulating interlayer 50. The bit line contact 52 may contact the active region 10b between the single crystalline epitaxial layer patterns 32. A bit line 54 may be formed on the bit line contact 52 and the first insulating interlayer 50. The bit line 54 may be arranged substantially perpendicular to the gate electrode 40a. Further, the bit line 54 may contact adjacent bit line contacts 52.

A hard mask pattern 56 may be formed on the bit line 54. A second insulating interlayer 58 may cover the bit line 54.

A storage node contact 60 may be formed through the second insulating interlayer 58 and the first insulating interlayer 50. The storage node contact 60 may contact an upper surface of the single crystalline epitaxial layer pattern 32.

A capacitor 62 may be formed on the storage node contact 60. Thus, the capacitor 62 may be electrically connected to the single crystalline epitaxial layer pattern 32.

According to the present embodiment, the DRAM device may include the vertical transistor having the nano-wire shaped channel region, so that the DRAM device may have a rapid operational speed. Further, the DRAM device may occupy only a small area.

Method of Manufacturing a DRAM Device

FIGS. 16 to 20 illustrate cross-sectional views of stages in a method of manufacturing the DRAM device of FIG. 14.

Figure 16:
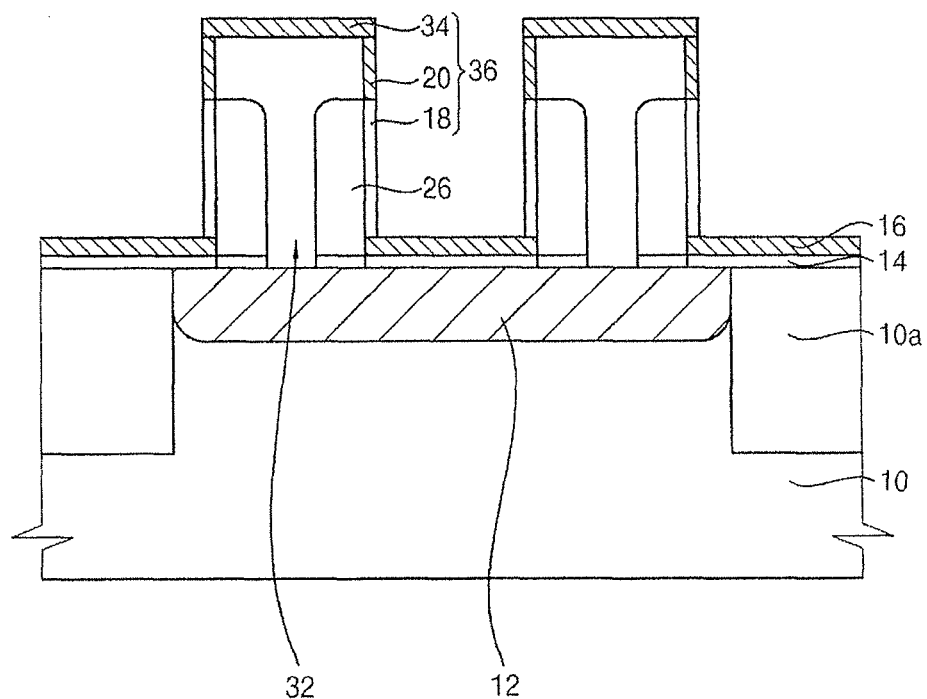
FIGS. 16 to 20 illustrate cross-sectional views of stages in a method of manufacturing the DRAM device of FIG. 14.

Referring to FIG. 16, a shallow trench isolation (STI) process may be performed on a semiconductor substrate 10 to define an active region and an isolation region 10b (not illustrated) of the semiconductor substrate 10. The active region may have an isolated shape. Further, the active region may be regularly arranged.

Impurities may be implanted into the semiconductor substrate 10 to form a first impurity region 12. Additionally, a channel doping process may be performed to control a threshold voltage of a transistor. In an implementation, the process for forming the first impurity region 12 may be performed prior to forming the active region.

Processes substantially the same as those illustrated with reference to FIGS. 4 to 10 may be performed to form a single crystalline epitaxial layer pattern 32 on the active region. The single crystalline epitaxial layer pattern 32 may have a shape vertically extending from an upper surface of the semiconductor substrate 10.

A sacrificial layer structure may be formed on the semiconductor substrate 10. The sacrificial layer structure may have openings exposing the first impurity region 12. Here, the sacrificial layer structure may cover the entire upper surface of the semiconductor substrate 10. Two epitaxial layer patterns 32 may be located in the single active region. Thus, the two openings may be located in the single active region.

An inner spacer 26 may be formed on side surfaces of the openings. The openings may be filled with the single crystalline epitaxial layer patterns 32. Each of the epitaxial layer patterns 32 may have a channel portion having a first width and a contact portion on the channel portion having a second width that may be greater than the first width. Thus, the two pillar-shaped single crystalline epitaxial layer patterns 32 may be formed in the single isolated active region. The single crystalline epitaxial layer pattern 32 may be used as an active body.

The channel portion of the single crystalline epitaxial layer pattern 32 may have a width of about 5 nm to about 30 nm. The sacrificial layer structure may then be patterned to expose a silicon oxide layer 18 of the sacrificial layer structure. Here, a pad oxide layer 14 and a silicon nitride layer 16 of the sacrificial layer structure may not be etched. Therefore, the pad oxide layer 14 and the silicon nitride layer 16 may remain on the active region and the isolation region 10b (not illustrated). The single crystalline epitaxial layer pattern 32 may be formed by, e.g., a laser epitaxial growth process.

Figure 17:
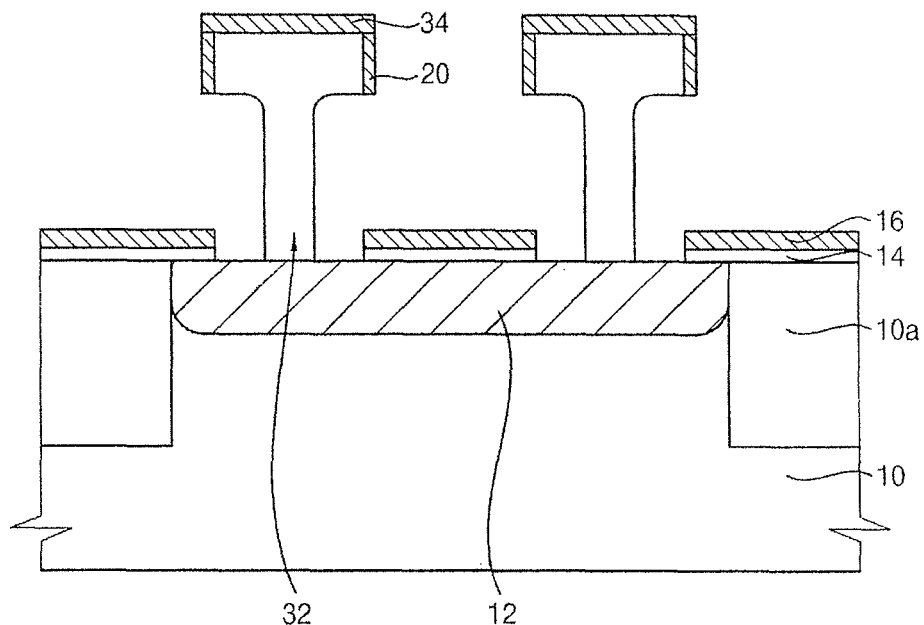

Referring to FIG. 17, the inner spacer 26 and the silicon oxide layer 18 on the sidewall of the single crystalline epitaxial layer pattern 32 may be removed by, e.g., an isotropic etching process. Here, because the isolation region 10b (not illustrated) may be covered with the silicon nitride layer 16, isolation layer patterns in the isolation region 10b may not be removed.

Figure 18:
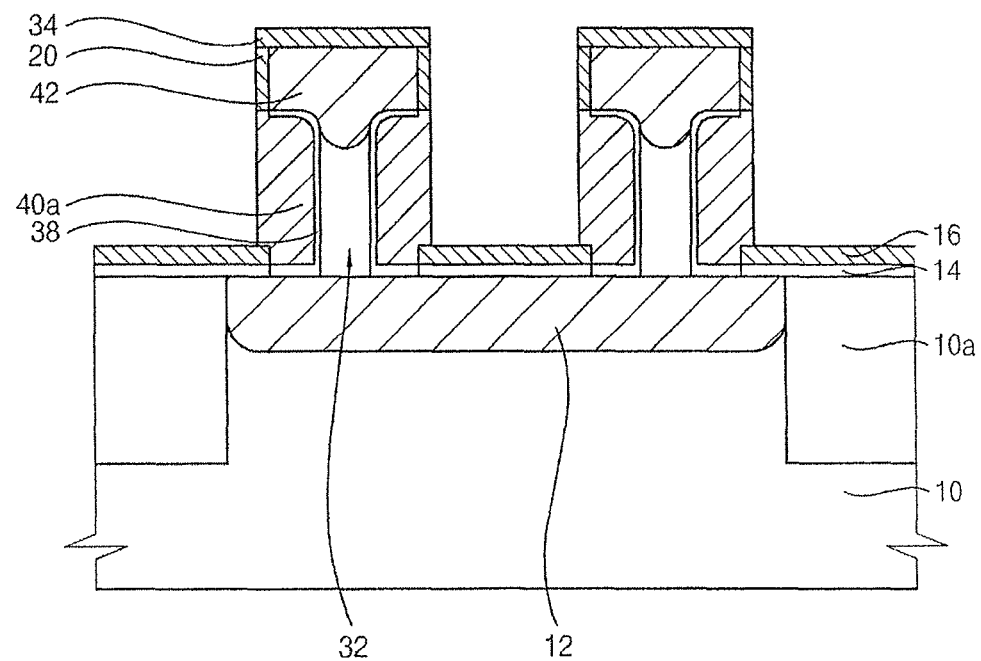

Referring to FIG. 18, a gate structure may be formed in a space generated by removing the inner spacer 26 and the silicon oxide layer 18. A gate insulating layer 38 may be formed on the sidewall of the single crystalline epitaxial layer pattern 32. The gate insulating layer 38 may be formed by, e.g., a thermal oxidation process. A gate electrode 40a may be formed on the gate insulating layer 38. The gate electrode 40a may have a linear shape surrounding the single crystalline epitaxial layer pattern 32. Here, the gate insulating layer 38 and the gate electrode 40a may be formed by processes substantially the same as those illustrated with reference to FIGS. 12 and 13. Because the gate electrode 40a may have the linear shape, the gate electrode 40a may be used commonly with a word line.

The gate electrode 40a may be arranged at an angle relative to an extending direction of the active region. That is, the gate electrode 40a and the active region may be arranged at an angle relative to one another of no more than about 90°. Therefore, cells of the DRAM device may be densely arranged, so that the DRAM device may have a high degree of integration.

Impurities may be implanted into the contact portion of the single crystalline epitaxial layer pattern 32 to form a second impurity region 42, thereby completing a vertical transistor. The process for forming the second impurity region 42 may be performed prior to forming the gate electrode 40a. That is, the process for forming the second impurity region 42 may be performed between the process for forming the single crystalline epitaxial layer pattern 32 and a process for forming the first insulating interlayer 50.

Figure 19:
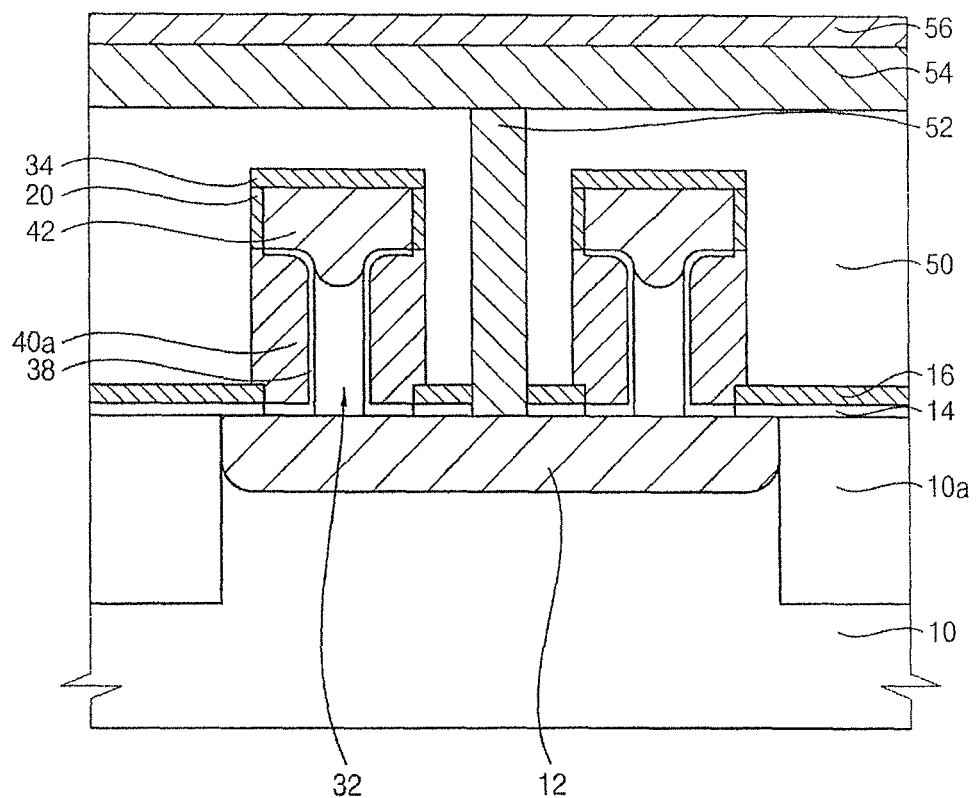

Referring to FIG. 19, the first insulating interlayer 50 may cover the vertical transistor. The first insulating interlayer 50 may be etched to form a contact hole exposing the active region between the single crystalline epitaxial layer patterns 32.

A first conductive layer (not shown) may be formed on the first insulating interlayer 50 to fill up the contact hole. The first conductive layer may be used as a bit line contact and a bit line. The first conductive layer may include no less than two layered structures. A hard mask pattern 56 may be formed on the first conductive layer. The hard mask pattern 56 may have a linear shape extending in a direction substantially perpendicular to the extending direction of the gate electrode 40a. The first conductive layer may be etched using the hard mask pattern 56 as an etch mask to form a bit line contact 52 and a bit line 54. Thus, the bit line contact 52 and the bit line 54 may be formed one body. Alternatively, after forming the bit line contact 52, the bit line 54 may be separately formed.

Figure 20:
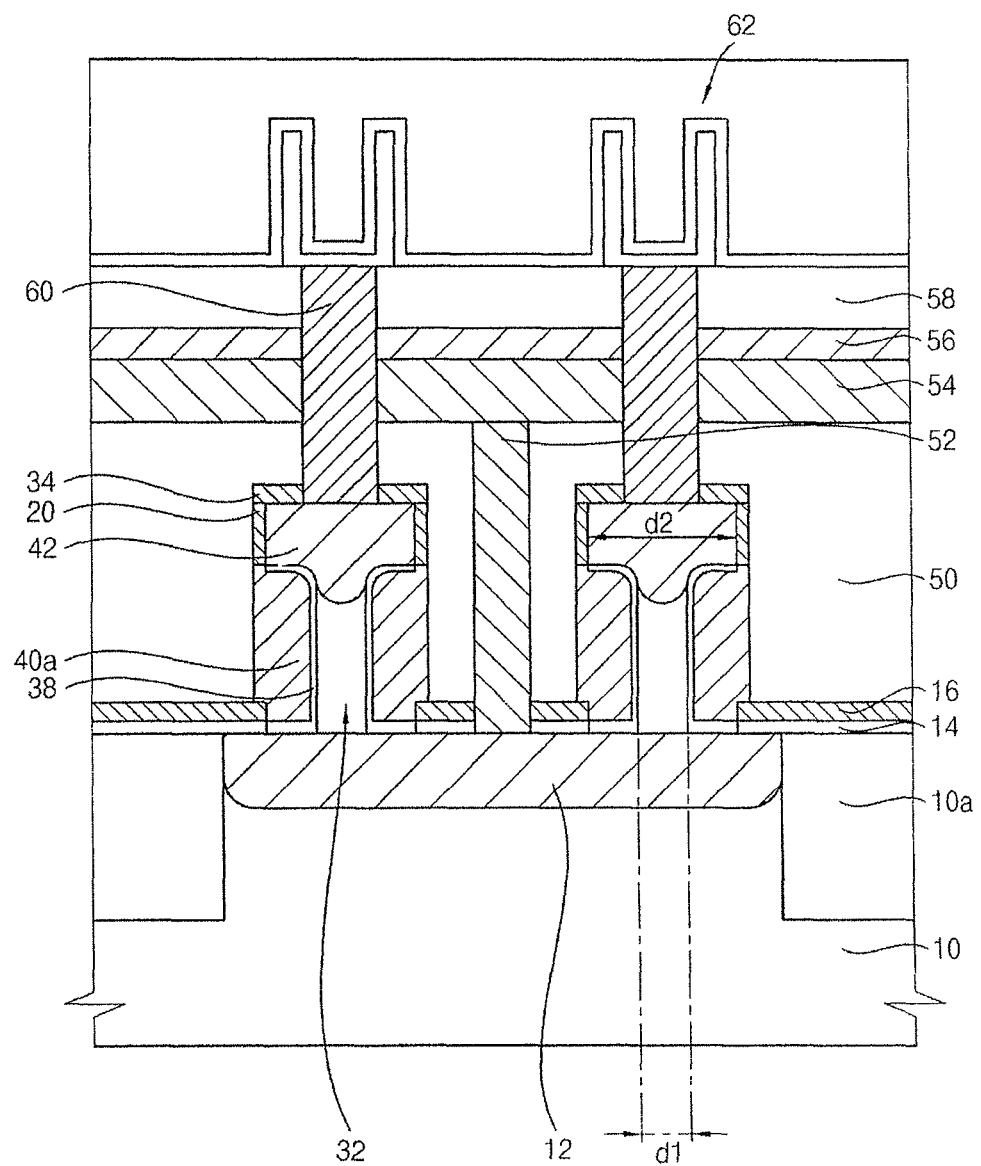

Referring to FIG. 20, a second insulating interlayer 58 may cover the bit line 54. The second insulating interlayer 58, the first insulating interlayer 50, and the second protecting layer 34 may be etched to form contact holes exposing the upper surface of the single crystalline epitaxial layer pattern 32. The contact holes may be filled with a conductive material to form storage node contacts 60.

The storage node contact 60 may not extend to the upper surface of the semiconductor substrate 10 in the active region. The storage node contact 60 may contact the upper surface of the single crystalline epitaxial layer pattern 32. Therefore, it may not be required to provide a region of the active region where the storage node contact 60 may be formed. As a result, the active region may occupy only a small area of the semiconductor substrate 10.

Further, the storage node contact 60 may have a relatively low height. The upper surface of the single crystalline epitaxial layer pattern 32, on which the storage node contact 60 may be formed, may have a large upper surface. Thus, the storage node contact 60 may be easily formed.

A capacitor 62 may be formed on the storage node contact 60. The capacitor 62 may have, e.g., a cylindrical shape, a stack shape, etc.

According to this embodiment, the DRAM device may include the vertical transistor having a narrow pillar width. Thus, the vertical transistor may have a rapid operational speed and occupy a small area. As a result, the DRAM device may have a high degree of integration and improved operational characteristics.

Memory System

Figure 21:
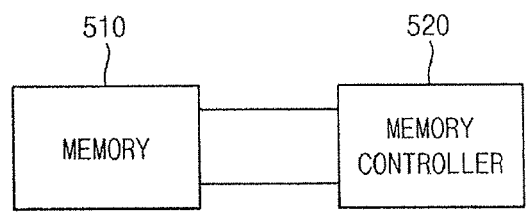
FIG. 21 illustrates a block diagram of a memory system in accordance with an embodiment.

FIG. 21 illustrates a block diagram of a memory system in accordance with an embodiment.

Referring to FIG. 21, a memory system of an embodiment may include a memory controller 520 and a memory 510. The memory 510 may include the vertical transistor of an embodiment. That is, the memory 510 may be used as the DRAM device of an embodiment. The memory controller 520 may input a signal into the memory 510 to control operations of the memory 510. The signal may include, e.g., a command signal, an address signal, an input/output signal, etc. The memory controller 520 may control data in the DRAM device in accordance with the signal.

Host System

Figure 22:
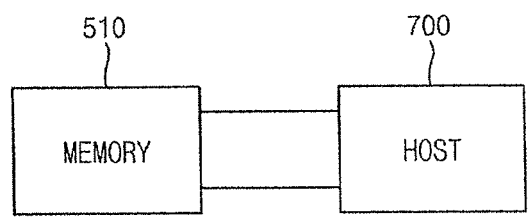
FIG. 22 illustrates a block diagram of a host system in accordance with an embodiment.

FIG. 22 illustrates a block diagram of a host system in accordance with an embodiment.

Referring to FIG. 22, a host system 700 of an embodiment may be connected to a memory 510. The memory 510 may include the vertical transistor of an embodiment. The host system 700 may include an electronic device, e.g., a personal computer, a camera, a mobile device, a game device, a communication device, etc. The host system 700 may apply a signal, which may be used for control and operate the memory 510, to the memory 510.

Portable Device

Figure 23:
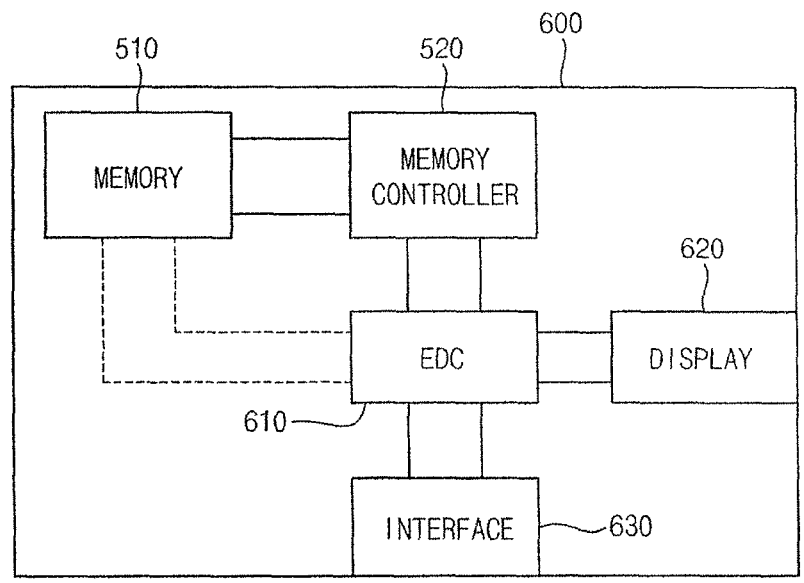
FIG. 23 illustrates a block diagram of a portable device in accordance with an embodiment.

FIG. 23 illustrates a block diagram of a portable device in accordance with an embodiment.

Referring to FIG. 23, a portable device 600 of an embodiment may include, e.g., an MP3 player, a video player, etc. The portable device 600 may include a memory 510 and a memory controller 520. The memory 510 may include a recessed channel array transistor of an embodiment. The transistor may be formed in a peripheral region of the memory 510. The portable device 600 may also include, e.g., an encorder/decorder 610, a display 620, and an interface 670. Data may be inputted/outputted into/from the memory 510 through the memory controller 520 by the encorder/decorder 620.

Computer system

Figure 24:
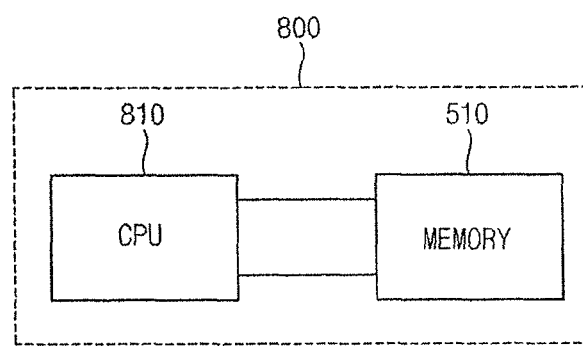
FIG. 24 illustrates a block diagram of a computer system in accordance with an embodiment.

FIG. 24 illustrates a block diagram of a computer system in accordance with an embodiment.

Referring to FIG. 24, the memory 510 may be connected with a central processing unit (CPU) 510 of a computer system 800. The computer system 800 may include, e.g., a personal computer, a personal data assistant device, etc. The memory 510 may be connected to the CPU 810 directly or indirectly via a bus. The memory 510 may include the recessed channel array transistor of an embodiment. The transistor may be formed in a peripheral region of the memory 510. Although not depicted in drawings, other elements may be included in the computer system 800.

General Commentary

Vertical transistors of an embodiment may be used in various semiconductor devices that include transistors. Particularly, vertical transistors of an embodiment may be used in a DRAM device and electronic devices including DRAM devices.

According to some embodiments, the vertical semiconductor device may have a nano-wire shaped channel region. Thus, a desirable volume inversion may be generated during operation of the vertical semiconductor device, so that the channel region may have a high conductivity. Further, the semiconductor device having the nano-wire shaped channel region may be formed by simple processes, so that a cost for manufacturing the semiconductor device may be reduced.

Exemplary embodiments have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A method of manufacturing a vertical semiconductor device, the method comprising:
    implanting impurities into a single crystalline substrate to form a first impurity region;
    forming a sacrificial layer structure on an upper surface of the substrate, such that the sacrificial layer structure has holes exposing the first impurity region on the upper surface of the single crystalline substrate;
    forming inner spacers on side surfaces of the holes;
    vertically forming single crystalline active bodies in the holes on the upper surface of the single crystalline substrate, such that each of the single crystalline active bodies has a first active portion on the substrate and a second active portion on the first active portion and such that the first active portion has a first width smaller than a second width of the second active portion;
    forming a gate insulating layer on a sidewall of the first active portion and the upper surface of the substrate;
    forming a gate electrode on the gate insulating layer, such that the gate electrode has a linear shape surrounding the active bodies; and
    implanting impurities into the second active portion to form a second impurity region.

2. The method as claimed in claim 1, wherein forming the sacrificial layer structure includes:
    forming a sacrificial layer on the substrate;
    forming a first protecting layer on the sacrificial layer; and etching the sacrificial layer and the first protecting layer to form the sacrificial layer structure having the holes.

3. The method as claimed in claim 2, wherein forming the sacrificial layer includes:
  forming a pad oxide layer on the substrate;
  forming a silicon nitride layer on the pad oxide layer; and
  forming a silicon oxide layer on the silicon nitride layer.

4. The method as claimed in claim 2, further including forming a second protecting layer on the sacrificial layer structure to cover the active bodies.

5. The method as claimed in claim 2, further including:
  patterning the sacrificial layer structure to expose the sacrificial layer; and
  removing the sacrificial layer and inner spacers to expose the sidewall of the first active portion.

6. The method as claimed in claim 5, wherein the gate insulating layer is formed on the exposed sidewall of the first active portion.

7. The method as claimed in claim 1, wherein the inner spacer has an upper surface lower than that of the sacrificial layer structure.

8. The method as claimed in claim 7, wherein a distance between the upper surface of the inner spacer and the upper surface of the sacrificial layer structure is substantially the same as a length of the second active portion.

9. The method as claimed in claim 1, wherein a width between the inner spacers in the hole is about 5 nm to about 30 nm.

10. The method as claimed in claim 1, wherein forming the active bodies includes:
  filling an opening between the inner spacers with a polysilicon layer pattern; and
  thermally treating the polysilicon layer pattern using a laser to form the active bodies.

11. The method as claimed in claim 1, wherein forming the gate insulating layer and the gate electrode includes:
  oxidizing surfaces of the first active portion and the substrate to form the gate insulating layer;
  forming a conductive layer on the substrate to cover the gate insulating layer; and
  patterning the conductive layer to form the linear gate electrode.

12. A method of manufacturing a DRAM device, the method comprising:
  implanting impurities in an upper surface of a single crystalline substrate to form a first impurity region;
  forming a sacrificial layer structure on the upper surface of the substrate, such that the sacrificial layer structure has holes exposing the first impurity region in the upper surface of the single crystalline substrate;
  forming inner spacers on side surfaces of the holes;
  vertically forming single crystalline active bodies in the holes on the upper surface of the single crystalline substrate, such that each of the single crystalline active bodies has a first active portion on the substrate and a second active portion on the first active portion and such that the first active portion has a first width smaller than a second width of the second active portion;
  forming a gate insulating layer on a sidewall of the first active portion and the upper surface of the substrate;
  forming a gate electrode on the gate insulating layer, such that the gate electrode has a linear shape surrounding the active bodies;
  implanting impurities into the second active portion to form a second impurity region;
  electrically connecting a bit line structure to the first impurity region; and
  electrically connecting a capacitor to the second impurity region.

13. The method as claimed in claim 12, wherein forming the active bodies includes:
  filling an opening between the inner spacers with a polysilicon layer pattern; and
  thermally treating the polysilicon layer pattern using a laser to form the active bodies.

14. The method as claimed in claim 3, wherein an upper surface of the silicon oxide layer is substantially aligned with an upper surface of the single crystalline active bodies.

15. The method as claimed in claim 5, wherein a portion of the first protecting layer remains after the removing of the sacrificial layer and inner spacers.

16. The method as claimed in claim 1, wherein a width of the active bodies is adjusted by controlling a thickness of the inner spacers.

17. The method as claimed in claim 1, wherein the gate electrode has an upper surface lower than an upper surface of the active bodies.

18. The method as claimed in claim 12, further including forming a storage node contact on an upper surface of each of the active bodies.

* * * * *